(12) United States Patent
Newsome et al.

(10) Patent No.: US 7,468,287 B2
(45) Date of Patent: Dec. 23, 2008

(54) METHOD OF FABRICATING A HETEROJUNCTION OF ORGANIC SEMICONDUCTING POLYMERS

(75) Inventors: Christopher Newsome, Cambridge (GB); Thomas Kugler, Cambridge (GB); Shunpu Li, Cambridge (GB); David Russell, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 479 days.

(21) Appl. No.: 11/363,063

(22) Filed: Feb. 28, 2006

(65) Prior Publication Data

US 2006/0247132 A1 Nov. 2, 2006

(30) Foreign Application Priority Data

Apr. 29, 2005 (GB) ................. 0508874.5

(51) Int. Cl.
*H01L 21/00* (2006.01)

(52) U.S. Cl. ............... 438/47; 438/94; 438/99; 438/312; 438/594; 438/597; 438/781; 257/E21.116

(58) Field of Classification Search ........... 438/47, 438/94, 99, 172, 191, 312, 493, 497, 761, 438/780, 781, FOR. 135; 257/E21.114–E21.116
See application file for complete search history.

(56) References Cited

U.S. PATENT DOCUMENTS 5,668,398 A * 9/1997 Havemann et al. .......... 257/522
2007/0092988 A1* 4/2007 Brabec et al. ................ 438/99

FOREIGN PATENT DOCUMENTS

WO WO 2005/004252 A2 1/2005

OTHER PUBLICATIONS

Chang, Shun-Chi et al., "Dual-color polymer light-emitting pixels processed by hybrid inkjet printing," Applied Physics Letters vol. 73(18), pp. 2561-2563, Nov. 1998.

* cited by examiner

*Primary Examiner*—Michelle Estrada
*Assistant Examiner*—Quovaunda Jefferson
(74) *Attorney, Agent, or Firm*—Oliff & Berridge, PLC

(57) ABSTRACT

Provided is a method of forming a heterojunction of contiguous layers of organic semiconducting polymers. The method comprises firstly forming a layer of a first organic semiconducting polymer on a substrate. A solution of a film-forming material is then deposited on the layer of the first organic semiconducting polymer. The first organic semiconducting polymer is insoluble in this solution and so is not disturbed by its deposition. The deposited solution is then dried to form a temporary film having a thickness of less then 20 nm formed from the film-forming material. Next a solution of a second organic semiconducting polymer dissolved in an organic solvent is deposited on the temporary film and this solution dried. The solubility of the material forming the temporary film in the organic solvent and the thickness of the temporary film are such that the organic solvent permeates through the thickness of the temporary film during drying of the solution of the second organic semiconducting polymer. This causes the temporary film to break down but without disturbing the layer of the first organic semiconducting polymer so that the layer of the second organic semiconducting polymer is formed contiguously on the layer of the first organic semiconducting polymer.

16 Claims, 3 Drawing Sheets

METHOD OF FABRICATING A HETEROJUNCTION OF ORGANIC SEMICONDUCTING POLYMERS

Figure 1:
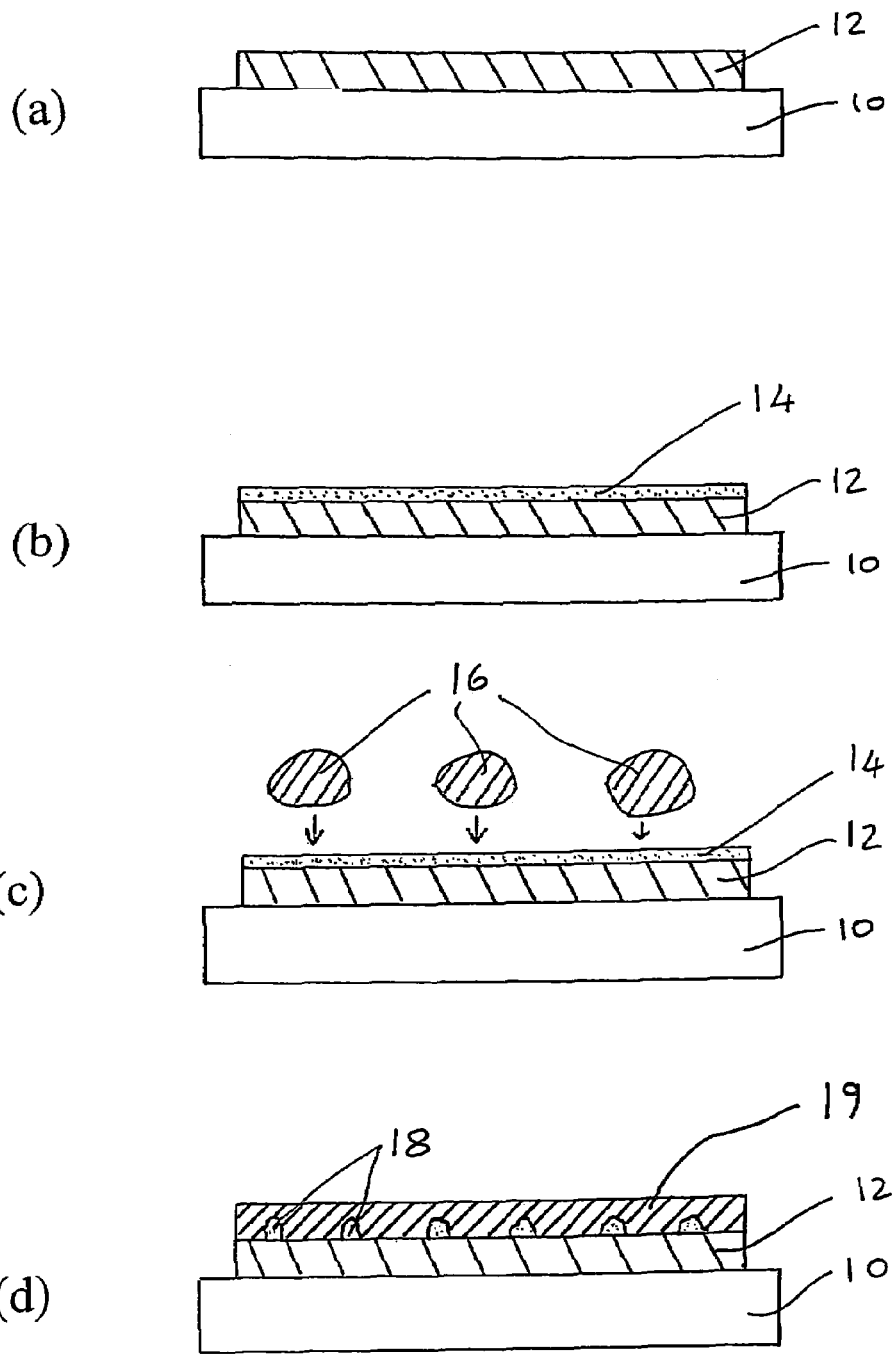

The present invention relates to a method of fabricating a heterojunction of contiguous layers of two organic semiconducting polymers. More particularly, the present invention relates to such a method in which the two contiguous layers have a well defined interface with negligible inter-mixing of their constituent polymers at their junction.

Most semiconducting devices presently in commercial production are formed from inorganic materials particularly silicon. However, the use of silicon is expensive because it typically requires a vacuum evaporation step to form it into a semiconducting layer. Organic semiconducting polymers are beginning to attract attention as alternatives inter alia because they can be formed into semiconducting layers by deposition as a solute in a solution followed by drying. Solution deposition is a much cheaper technique to put into commercial practice than vacuum evaporation. A layer of organic semiconducting polymer can be formed by dissolving the polymer in an appropriate organic solvent, depositing the resulting solution by techniques such as spin-coating or ink-jet printing, and then evaporating away the solvent in a drying step.

There are a number of semiconductor device types which incorporate a heterojunction of contiguous semiconducting layers. Examples of such device types include light-emitting diodes, dielectric stacks and photovoltaic devices. The efficiency of such devices depends upon there being a clearly defined junction between the contiguous layers, that is there should be minimal inter-mixing between the two organic semiconducting polymers present in the contiguous layers.

When depositing an organic semiconducting polymer as a solution, a solvent is selected in which the polymer has high solubility. This ensures that the maximum quantity of organic semiconducting polymer can be dissolved in a given volume of solvent in order to facilitate formation of a solid thin-film of the organic semiconducting polymer after evaporation of a minimum quantity of solvent.

A significant problem arises when fabricating a heterojunction of contiguous layers of organic semiconducting polymers. After casting of the first organic semiconducting polymer layer, the solvent comprised in the solution of the second tends to dissolve the first organic semiconducting polymer leading to inter-mixing of the two organic semiconducting polymers. This causes the interface between the two layers to be poorly defined which degrades the performance characteristics of the heterojunction. Such a problem arises because organic semiconducting polymers all tend to be soluble in similar organic solvents. As a consequence, a good solvent for the second organic semiconducting polymer is invariably a good solvent for the previously deposited first organic semiconducting polymer especially if these polymers possess similar structural moieties.

In the specification which follows, the terms "insoluble", "partially soluble" and "soluble" in connection with a solid and a solvent are respectively defined to mean that no more than 0.1 grams of the solid can be dissolved in one liter of the solvent at room temperature (20° C.); 0.1-5 grams of the solid can be dissolved in one liter of the solvent at room temperature; and greater than 5 grams of the solid can be dissolved in one liter of the solvent at room temperature.

The problem tackled by the present invention is to provide a method for fabricating a heterojunction of contiguous layers of first and second organic semiconducting polymers using solution deposition techniques which minimises the tendency of the polymers to inter-mix at their junction.

According to a first aspect, the present invention provides a method of forming a heterojunction of contiguous layers of first and second organic semiconducting polymers comprising the steps of:

(i) forming a layer of the first organic semiconducting polymer on a substrate, (ii) depositing a solution of a film-forming material on the layer of the first organic semiconducting polymer, the first organic semiconducting polymer being insoluble in the solution, (iii) drying the deposited solution to form a temporary film having a thickness of less than 20 nm formed from the film-forming material, (iv) depositing a solution of the second organic semiconducting polymer dissolved in an organic solvent (A) on the temporary film, and (v) drying the deposited solution, the solubility of the material forming the temporary film in the organic solvent (A) and the thickness of the temporary film being such that the organic solvent (A) permeates through the thickness of the temporary film during the duration of the drying step (v) causing the temporary film to break down but without substantially disturbing the layer of the first organic semiconducting polymer so that the layer of the second organic semiconducting polymer is formed contiguously on the layer of the first organic semiconducting polymer.

The presence of the temporary film prevents the organic solvent (A) dissolving the first organic semiconducting polymer when the solution of the second organic semiconducting polymer is deposited. Rather, the solubility of the material forming the temporary film in the solvent (A) and the thickness of the temporary film are selected such that the organic solvent (A) takes time to permeate through the thickness of the temporary film whilst it is drying resulting in the breakdown of the temporary film by its being dissolved or dispersed in the organic solvent (A). As a consequence, the layer of the second organic semiconducting polymer is contiguously formed on the layer of the first organic semiconducting polymer but without there being substantially any inter-mixing therebetween.

In order to fulfil its function, the material forming the temporary film is partially soluble in the organic solvent (A). It will be appreciated that if the material forming the temporary film is insoluble in the organic solvent (A), then this film will remain intact and so separate the layers of the first and second organic semiconducting polymers from each other. The presence of this intervening film would seriously degrade the performance characteristics of the heterojunction. On the other hand, if the material forming the temporary film is soluble in the organic solvent (A), then the temporary film will have little effect as the organic solvent (A) will quickly dissolve it away and then dissolve the first organic semiconducting polymer leading to the disadvantageous mixing of the latter with the second organic semiconducting polymer.

Preferably, the solution of the film-forming material is spin-coated on the layer of the first organic semiconducting polymer. Such a technique is advantageous because it ensures that the temporary film has both an appropriate thickness and a uniform thickness. This uniformity ensures that the rate of diffusion of the organic solvent (A) through the temporary film is constant across the area of the temporary film over which the solution of the second organic semiconducting polymer is deposited. In this context, "uniform" means that the thickness of any part of the temporary film is within 10%, more preferably 5%, of the average thickness of the temporary film.

The thickness of the temporary film is less than 20 nm. Therefore its volume is relatively small. This avoids excessive contamination of the heterojunction by the material forming the temporary film after the latter's break down. In this regard, the thickness of the temporary film is preferably 0.5-20 nm and most preferably 1-10 nm.

Preferably the solution of the film-forming material comprises a polymer, particularly an organic polymer, as the film forming material dissolved in a solvent (B) whose polarity is greater than that of the organic solvent (A). The use of such a polar solvent is intended to ensure that the first organic semiconducting polymer is insoluble in this solution. Preferably, the solvent (B) is an organic solvent selected from a ketone, an aldehyde, an alcohol or an ether. Preferably the polymer is an organic polymer selected from a polyvinyl-phenol, a polystyrene and a polyester.

Preferably the solution of the second organic semiconducting polymer is ink-jet printed onto the temporary film. The droplets which are ink-jet printed cause the temporary film to break down into discrete annuli, each annulus being the result of the impact of an individual droplet on the temporary film. This has the advantage of ensuring that the area of the interface between the first and second organic semiconducting polymers is as great as possible by minimising the area occupied by the break down residue of the temporary film.

Preferably the organic solvent (A), the material forming the temporary film, and the thickness of the temporary film are selected such that the temporary film is broken down by the organic solvent (A) by the film dissolving or becoming dispersed therein during the duration of the drying step (v).

According to a second aspect, the present invention provides a method of fabricating a semiconducting device which comprises contiguous layers of two different organic semiconducting polymers comprising forming such layers in accordance with the method described above. Any device requiring a discrete polymer/polymer heterojunction can be fabricated by this method but it is preferred that the semiconducting device is a light-emitting diode, a thin film transistor, a dielectric stack or a photovoltaic device.

Figure 2:
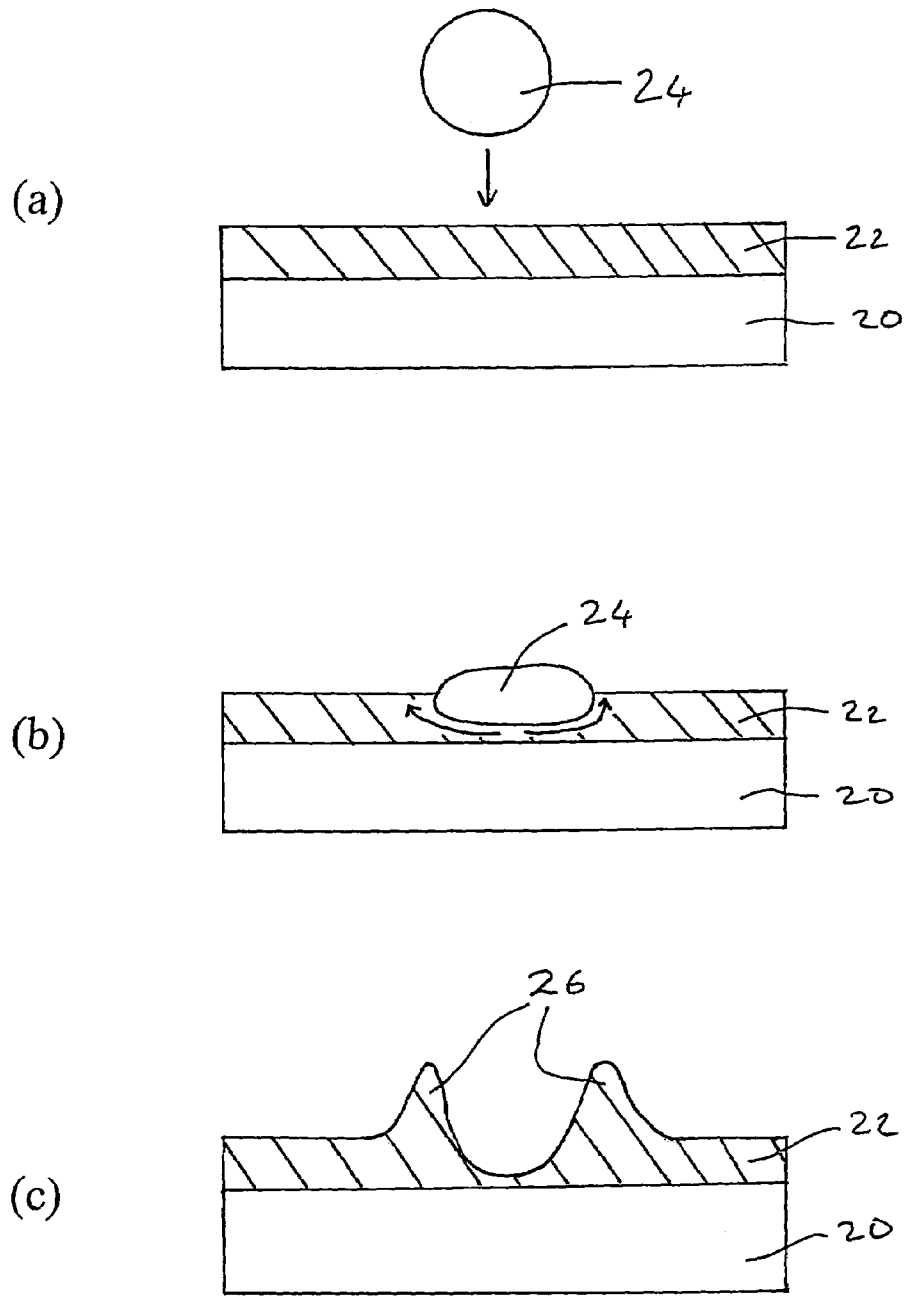
Figure 3:
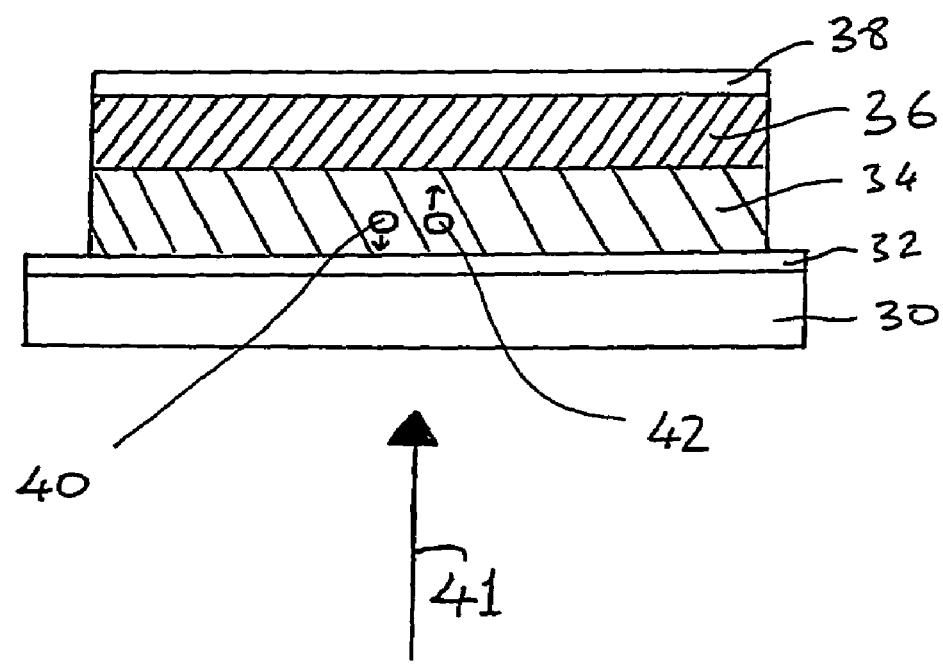

The present invention will now be described in further detail with reference to the accompanying drawings wherein:

FIG. 1 schematically illustrates in cross-section the method of the invention of forming a heterojunction of contiguous layers of organic semiconducting polymers, FIG. 2 schematically illustrates in cross-section the formation of a crater structure formed by ink-jet printing a solvent droplet (containing no polymer solid) onto a polymer film, and FIG. 3 schematically illustrates in cross-section a photovoltaic device comprising contiguous layers of different organic semiconducting polymers.

Turning firstly to 1, this schematically illustrates in cross-section a preferred embodiment according to the first aspect of the present invention. Thus, FIG. 1(a) illustrates a substrate 10 bearing a layer 12 of the first organic semiconducting polymer. The substrate 10 may be formed from any conventional material such as plastics, e.g. polyethylenenaphthalate (PEN) or polymethylmethacrylate, or glass. The substrate may include pre-patterned electrodes. Thus the term substrate in this context is intended to encompass not only purely structural supports, but also supports on which certain functional layers have been pre-fabricated.

The layer 12 of the first organic semiconducting polymer may be formed by spin-coating or ink-jet printing a solution of the first organic semiconducting polymer on the substrate 10 and then drying the solution by heating on a hotplate or in an oven, or by vacuum drying. Typically the layer 12 has a thickness of 10-100 nm, preferably 20-70 nm. The first organic semiconducting polymer may be a polythiophene (e.g. 3-hexylthiophene), a polyarylamine, a polyfluorene, a poly(paraphenylene vinylene), or a copolymer of any combination of these. These organic semiconductors are typically soluble in relatively nonpolar organic solvents such as benzene optionally substituted by up to 4 alkyl groups, unsubstituted or alkyl substituted thiophenes or cyclic hydrocarbons such as cyclohexane. Examples of such solvents include benzene, o-, m-, and p-xylene, toluene, trimethyl benzene and tetramethyl benzene. If the heterojunction is to be used in a LED or photovoltaic device, then the semiconductor is selected so that it has an efficient hole injecting characteristic typically characterized by having an ionisation potential close to that of the work function of an electrode which forms part of the substrate 10. This electrode ultimately forms the anode contact in such semiconducting devices.

The next step is to form a temporary film 14 on the layer 12 of the first organic semiconducting polymer as illustrated in FIG. 1(b). The film may be formed by depositing a solution of a film-forming material on the layer 12 of the first organic semiconducting polymer. In this step, it is important that the first organic semiconducting polymer is insoluble in the solution of the film-forming material. This ensures that the layer 12 is not disturbed by depositing the solution of the film-forming material over it. The deposited solution is then dried to form a temporary film.

Preferably the solution of the film-forming material is spin-coated on the layer of the first organic semiconducting polymer as this results in the film having a relatively uniform thickness. This uniform thickness helps to ensure in a subsequent step that the temporary film is uniformly broken down over its whole area in order to achieve good contact between the first and second organic semiconducting polymer layers.

Alternatively, the solution of the film-forming material may be deposited by ink-jet printing. This is advantageous if it is desired to form the temporary film in a pattern on the layer of the first organic semiconducting polymer.

The solution of the film-forming material deposited on the first organic semiconducting polymer layer preferably comprises a polymer dissolved in a solvent (B) whose polarity is greater than that of the organic solvent (A). The polymer may have a concentration of 0.05-10 g/l in the solvent. For instance, the solvent (B) may be an organic solvent such as an alcohol (e.g. 2-propanol), an aldehyde, a ketone or an ether. The polymer may be an organic polymer, for example a polyvinyl-phenol such as poly(4-vinylphenol) (PVP), a polyvinyl alcohol (PVA), a polystyrene, poly(methyl-pentene), polyisoprene or a polyester such as polymethyl methacrylate.

The thickness of the temporary film should be relatively small as this avoids later excessive contamination of the layer of the second organic semiconducting polymer by the break down products of the temporary film. The film has a thickness of less than 100 nm, preferably less than 20 nm, more preferably 0.5-20 nm and most preferably 1-10 nm. The solution of the film-forming material is dried in order to remove the solvent (B). This can be carried out at room temperature or more preferably at 30-100° C. by, for instance, heating in an oven or on a hotplate or by vacuum drying.

It will be appreciated that the use of a relatively polar organic solvent (B) to deposit the film-forming material will not disturb the layer of the first organic semiconducting polymer. This is because such semiconducting polymers are typically insoluble in relatively polar solvents such as alcohols, aldehydes, ketones and ethers.

After the temporary film has been formed by drying the solution of the film-forming material, a solution of the second organic semiconducting polymer dissolved in an organic solvent (A) is deposited on the temporary film as illustrated in FIG. 1(c). The concentration of such a solution is preferably 0.5-30 g/l. Here the solution of the second organic semiconducting polymer is illustrated in the form of droplets 16. Such droplets can be conveniently deposited by the technique of ink-jet printing. Droplets typically have a diameter of 30 µm in flight, creating a printed feature whose diameter is in the range 40-200 µm depending upon the wetting behaviour of the droplet solution on the substrate surface. The technique of using ink-jet printing has two advantages. The first advantage is that it directly helps to break down the temporary film due to the so-called cratering effect which will be described below. Secondly, ink-jet printing can be used to form the layer of the second organic semiconducting polymer in a pattern if desired. As an alternative, the solution of the second organic semiconducting polymer can be deposited by other known solution casting methods such as spin-coating.

Whilst the organic solvent (A) in the deposited solution of the second organic semiconducting polymer dries, it simultaneously breaks down the temporary film resulting in the layer 19 of the second organic semiconducting polymer being formed contiguously on the layer 12 of the first organic semiconducting polymer. This is achieved by appropriately selecting the solubility of the material forming the temporary film in the organic solvent (A) and the thickness of the temporary film such that the organic solvent (A) permeates at a controlled rate through the thickness of the temporary film during the drying of the solution of the second organic semiconducting polymer. The rate of this permeation is such that at the point at which the solution has dried, it reaches the surface of the layer 12 of the first organic semiconducting polymer.

One particular way in which the permeation rate of the organic solvent (A) through the temporary film can be controlled is by appropriately adjusting the molecular weight of the polymer forming the latter. Typical molecular weights are 20,000-300,000. Generally speaking, the higher the molecular weight of the material forming the temporary film, the longer is the time which is required to dissolve or disperse the material into the solution of the second organic semiconducting polymer. Therefore by appropriately adjusting the molecular weight of this material and the thickness of the temporary film, the permeation rate of the solution of the second organic semiconducting polymer through the temporary film towards the layer 12 of the first organic semiconducting polymer can be finely controlled. If it is found that the permeation rate is too high for a particular solvent, then the molecular weight of the polymer forming the temporary film can be increased and/or the thickness of the temporary film can be increased. On the other hand, if the permeation rate is too low, then the molecular weight of the polymer forming the temporary film can be decreased and/or the thickness of the temporary film can be decreased.

In a particularly preferred aspect, the material forming the temporary film, the thickness of the temporary film and the organic solvent (A) are selected such that the temporary film is broken down by the organic solvent (A) by it dissolving or becoming dispersed therein during the duration of the drying step (v).

The mechanism for this is that the solution of the second organic semiconducting polymer diffuses into the temporary film whilst the solution is drying. For this to be achieved, the organic solvent (A) is selected such that the material forming the temporary film is partially soluble in it. Preferably the organic solvent (A) is an unsubstituted or alkyl substituted thiophene, a cyclic hydrocarbon such as cyclohexane or a compound of formula:

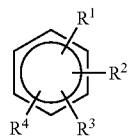

wherein $R^1$, $R^2$, $R^3$ and $R^4$ independently represent hydrogen or $C_{1-6}$ alkyl. Preferably the organic solvent (A) is benzene, toluene or o-, m- or p-xylene.

It will be appreciated that the partial solubility of the material forming the temporary film in the organic solvent (A) is an important characteristic. If the material were to be soluble in the solvent (A), (i.e. it has a solubility of greater than 5 grams per liter), then the temporary film would have no effect and would simply be dissolved away when the solution of the second organic semiconducting polymer was deposited. On the other hand, if the material were to be insoluble in the solvent (A) (i.e. it has a solubility of less than 0.1 grams per liter), then the temporary film would remain intact resulting in there being no contiguity between the layers of the first and second organic semiconducting polymers.

Accordingly, the material forming the temporary film is selected such that it is partially soluble in the solvent (A). Such partial solubility results in the controlled diffusion of the solution of the second organic semiconducting polymer onto the layer of the first organic semiconducting polymer thus ensuring their contiguity. During the drying step, the temporary film 14 is broken down such that its material becomes dispersed in the layer 19 of the second organic semiconducting polymer. To some extent this is illustrated in FIG. 1(d) which illustrates that the temporary film which existed has been broken down and the material forming it become dispersed as residual clumps 18 in the layer 19.

The second organic semiconducting polymer may be the same or a different basic type of polymer as the first organic semiconducting polymer. Thus for instance it can be a polyarylamine, a polyfluorene, a poly(paraphenylenevinylene) or a copolymer of any combination thereof. In case the second organic semiconducting polymer is the same basic species as the first, then different copolymer units are incorporated in order to facilitate more efficient injection of opposite charge carriers into the polymer constituting the first organic semiconducting layer otherwise self-evidently a heterojunction will not be formed. The thickness of the layer 19 of the second organic semiconducting polymer is preferably 10-100 nm, preferably 20-70 nm.

As previously mentioned, it is preferred that the solution of the second organic semiconducting polymer is ink-jet printed onto the temporary film. In this case, the ink-jetted droplets cause the temporary film to be broken down into discrete annuli, each annulus corresponding to a droplet. This is the result of the so-called cratering effect which will now be explained by reference to 2.

FIG. 2(a) illustrates a droplet of pure solvent descending onto a polymer film 22 which is partially soluble in the solvent. The polymer film is in turn supported by a substrate 20.

After impact of the solvent droplet 24 onto the polymer film 22 illustrated in FIG. 2(b), the polymer at the interface dissolves into the solvent. There is a variation in the drying rate of the droplet across its diameter. The air at the perimeter of the droplet contains a relatively low concentration of solvent in contrast to the air surrounding the centre of the droplet. Such a contrast results in a varying solvent vapour pressure across the diameter of the droplet and thus a variation in the drying rate. This differential drying rate results in the solvent being transported from the centre of the solvent drop to the edge due to the enhanced evaporation there. Consequently, the polymer which becomes dissolved in the solvent thickens at the edge due to the enhanced evaporation there, resulting in the thickness profile illustrated in FIG. 2(c). This cross-sectional view illustrates that a roughly circular crater 26 of polymer is formed whose rim corresponds to the perimeter of the droplet 24 illustrated in FIG. 2(b).

Returning to FIG. 1(d), this cratering effect results in the temporary film being dispersed into annuli, one of which is shown generally as 18 in cross-section. Thus FIG. 1(d) illustrates three such annuli in cross-section corresponding to the three droplets 16 illustrated in FIG. 1(c). Such dispersal of the temporary film ensures that there is a relatively large area of direct contact between the first and second organic semiconducting polymer layers so that a good heterojunction is formed.

The quantity of material in each annulus 18 depends upon the thickness of the temporary film. Clearly excessive film thicknesses should not be used, otherwise the volume of the dispersed material resulting from the break down of the temporary film will prevent there being a good contact at the heterojunction. Additionally, the actual position and number of annuli can be controlled by selecting the position and size of the ink-jetted droplets 16. The volume of these droplets can be controlled by adjusting the driving waveform used for ejection. It is preferred to minimize the total number of droplets used to deposit the second organic semiconducting polymer as this results in fewer annuli being formed and therefore a greater area of contact between the first and second organic semiconducting polymer layers 12, 19 at their heterojunction.

3 illustrates a practical application of a heterojunction of the type formed by the present invention. This illustrates a photovoltaic device comprising a substrate 30 formed, for instance, from glass which supports an anode 32 which for instance can be made from indium tin oxide. The anode supports a heterojunction of layers 34 and 36 of different organic semiconducting polymers. Finally a cathode formed for instance of calcium covered by aluminium is formed on the outer surface of the layer 36 of organic semiconducting polymer. The semiconductor layers 34 and 36 are typically 50 nm thick. They can be formed for instance from differently doped polythiophenes. The polythiophene in the layer 34 adjacent the anode should have a HOMO level similar to that of the work function of indium tin oxide which is 4.5 eV. The band gap is typically 3 eV. The polythiophene layer in the layer 36 adjacent the cathode should have a LUMO level higher than that of the cathode work function which is 2.9 eV for calcium. This aids electron injection. A typical value would be 3.5 eV with a band gap of 2.5 eV to 2.8 eV.

When light is shone through the glass substrate 30 schematically shown as arrow 41, holes 40 and electrons 42 are formed in the first semiconductor layer which respectively migrate to the anode and cathode which causes a current to flow in an external circuit connected by the anode and cathode. The efficiency of the photovoltaic device depends upon the ability of the electrons and holes to migrate to the cathode and anode respectively. This migration is improved when the two semiconductor layers have a well defined interface with little or no inter-mixing between the semiconductors of the two layers.

Other possible semiconductor devices including a heterojunction formed by the method of the present invention include light emitting diodes or dielectric stacks. Further, the method of the present invention can be used to fabricate devices which include multiple pairs of polymer-polymer semiconductor interfaces. Thus by simply repeating the method steps of the present invention, many polymer-polymer heterojunction interfaces can be fabricated.

Thus the present invention further provides a method of fabricating a semiconductor device which comprises contiguous layers of two different organic semiconducting polymers comprising forming such layers in accordance with the method of the first aspect of the present invention. It is further possible that the semiconductor device may comprise two or more heterojunctions, each hereojunction being formed in accordance with the method of the first aspect of the present invention. For instance, the device may include a plurality of discrete heterojunctions separated from one another. Alternatively, the device may include three or more layers of semiconducting polymers as a stack in which each adjacent pair of polymers is different. Each successive layer of the stack is deposited on a temporary film formed on the previously deposited semiconducting layer. In other words steps (ii)-(v) of the first aspect of the present invention can be successively carried out in order to form successive layers of organic semiconducting polymer in the form of a stack. Preferably the semiconductor device is a light-emitting diode, a dielectric stack or a photovoltaic device.

The invention claimed is:

1. A method of forming a heterojunction of contiguous layers of first and second organic semiconducting polymers comprising the steps of:
    (i) forming a layer of the first organic semiconducting polymer on a substrate,
    (ii) depositing a solution of a film-forming material on the layer of the first organic semiconducting polymer, the first organic semiconducting polymer being insoluble in the solution,
    (iii) drying the deposited solution to form a temporary film having a thickness of less than 20 nm formed from the film-forming material,
    (iv) depositing a solution of the second organic semiconducting polymer dissolved in an organic solvent (A) on the temporary film, and
    (v) drying the deposited solution,
the solubility of the material forming the temporary film in the organic solvent (A) and the thickness of the temporary film being such that the organic solvent (A) permeates through the thickness of the temporary film during the duration of the drying step (v) causing the temporary film to break down but without substantially disturbing the layer of the first organic semiconducting polymer so that the layer of the second organic semiconducting polymer is formed contiguously on the layer of the first organic semiconducting polymer.

2. A method according to claim 1, wherein the layer of the first organic semiconducting polymer is formed by spin-coating or ink-jet printing a solution of the first organic semiconducting polymer on the substrate and subsequently drying the solution.

3. A method according to claim 1, wherein the solution of the film-forming material is spin-coated on the layer of the first organic semiconducting polymer.

4. A method according to claim 3, wherein the thickness of the temporary film is 0.5-20 nm.

5. A method according to claim 1, wherein the solution of the film-forming material comprises a polymer dissolved in a solvent (B) whose polarity is greater than that of the organic solvent (A).

6. A method according to claim 5, wherein the solvent (B) is an organic solvent selected from an alcohol, a ketone, an aldehyde and an ether.

7. A method according to claim 5, wherein the polymer is an organic polymer selected from a polyvinyl-phenol, a polystyrene, a polyvinyl alcohol, poly(methyl-pentene), polyisoprene and a polyester.

8. A method according to claim 1, wherein the solution of the second organic semiconducting polymer is ink-jet printed onto the temporary film, the ink-jetted droplets causing the temporary film to break down into discrete annuli, each annulus being the result of the impact of an individual droplet on the temporary film.

9. A method according to claim 8, wherein the solution of the second organic semiconducting polymer is ink-jet printed on the temporary film in a predetermined pattern.

10. A method according to claim 1, wherein the material forming the temporary film, the thickness of the temporary film and the organic solvent (A) are selected such that the temporary film is broken down by the organic solvent (A) by it dissolving or becoming dispersed therein during the duration of the drying step (v).

11. A method according to claim 1, wherein the organic solvent (A) is an unsubstituted or alkyl substituted thiophene, a cyclic hydrocarbon or a compound of formula:

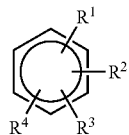

wherein $R^1$, $R^2$, $R^3$ and $R^4$ independently represent hydrogen or $C_{1-6}$ alkyl.

12. A method according to claim 1, wherein the thickness of the layer of the first organic semiconducting polymer is 10-100 nm.

13. A method according to claim 1, wherein the thickness of the layer of the second organic semiconducting polymer is 10-100 nm.

14. A method of fabricating a semiconducting device which comprises contiguous layers of two different organic semiconducting polymers comprising forming such layers in accordance with the method of claim 1.

15. A method according to claim 14, wherein the semiconducting device comprises two or more heterojunctions, each heterojunction being formed in accordance with a method comprising the steps of:
   (i) forming a layer of the first organic semiconducting polymer on a substrate,
   (ii) depositing a solution of a film-forming material on the layer of the first organic semiconducting polymer, the first organic semiconducting polymer being insoluble in the solution,
   (iii) drying the deposited solution to form a temporary film having a thickness of less than 20 nm formed from the film-forming material,
   (iv) depositing a solution of the second organic semiconducting polymer dissolved in an organic solvent (A) on the temporary film, and
   (v) drying the deposited solution,
the solubility of the material forming the temporary film in the organic solvent (A) and the thickness of the temporary film being such that the organic solvent (A) permeates through the thickness of the temporary film during the duration of the drying step (v) causing the temporary film to break down but without substantially disturbing the layer of the first organic semiconducting polymer so that the layer of the second organic semiconducting polymer is formed contiguously on the layer of the first organic semiconducting polymer.

16. A method according to claim 15, wherein the semiconducting device is a light-emitting diode, a thin film transistor, a dielectric stack or a photovoltaic device.

* * * * *